US008380768B2

(12) United States Patent
Hoefler

(10) Patent No.: US 8,380,768 B2
(45) Date of Patent: Feb. 19, 2013

(54) RANDOM NUMBER GENERATOR

(75) Inventor: Alexander B. Hoefler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1057 days.

(21) Appl. No.: 12/363,275

(22) Filed: Jan. 30, 2009

(65) Prior Publication Data

US 2010/0198896 A1 Aug. 5, 2010

(51) Int. Cl.
*G06F 7/58* (2006.01)
(52) U.S. Cl. ........................................ 708/250
(58) Field of Classification Search .................. 708/250
See application file for complete search history.

(56) References Cited

U.S. PATENT DOCUMENTS

| 6,950,342 | B2 | 9/2005 | Lindhorst et al. |
| 2001/0035771 | A1* | 11/2001 | Mullarkey ........................ 326/39 |
| 2005/0105366 | A1* | 5/2005 | Pedlow, Jr. ...................... 365/225.7 |
| 2007/0050622 | A1* | 3/2007 | Rager et al. ...................... 713/168 |
| 2008/0270152 | A1 | 10/2008 | Menezes |

* cited by examiner

*Primary Examiner* — Kuen Lu
(74) *Attorney, Agent, or Firm* — Joanna G. Chiu; James L. Clingan, Jr.

(57) ABSTRACT

A random number generator includes a first one time programmable (OTP) element and a second OTP element. The first OTP element and second OTP element have a first distribution of probable values for an electrical characteristic when unprogrammed and a second distribution of probable values when programmed. A programming circuit applies a programming signal to the first OTP element and to the second OTP element that causes the first OTP element to switch from being unprogrammed to being programmed and having a first value for its electrical characteristic and the second OTP element to switch from being unprogrammed to being programmed and having a second value for its electrical characteristic. A sense amplifier provides an output signal at a first logic state when the first value exceeds the second value and at a second logic state when the second value exceeds the first value.

16 Claims, 3 Drawing Sheets

RANDOM NUMBER GENERATOR

BACKGROUND

1. Field

This disclosure relates generally to random number generators, and more specifically, to a random number generator including one time programmable (OTP) elements.

2. Related Art

Random numbers are commonly needed in various applications, such as in security applications. However, when random numbers are stored using One Time Programmable (OTP) devices, these random numbers are at risk for being discovered. For example, in many cases, the state of these OTP devices (i.e. whether each OTP device is in a programmed or unprogrammed state) is easily discernable using relatively simple analysis, such as by using Scanning Electron Microscopy (SEM) analysis. For example, one such OTP device is a polysilicon-based electrically programmable fuse in which SEM analysis may be used to detect the physical damage in the fuselink when programmed. Furthermore, if the states of the OTP devices are discernable then they may be easily replicated as well, which is also undesirable.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
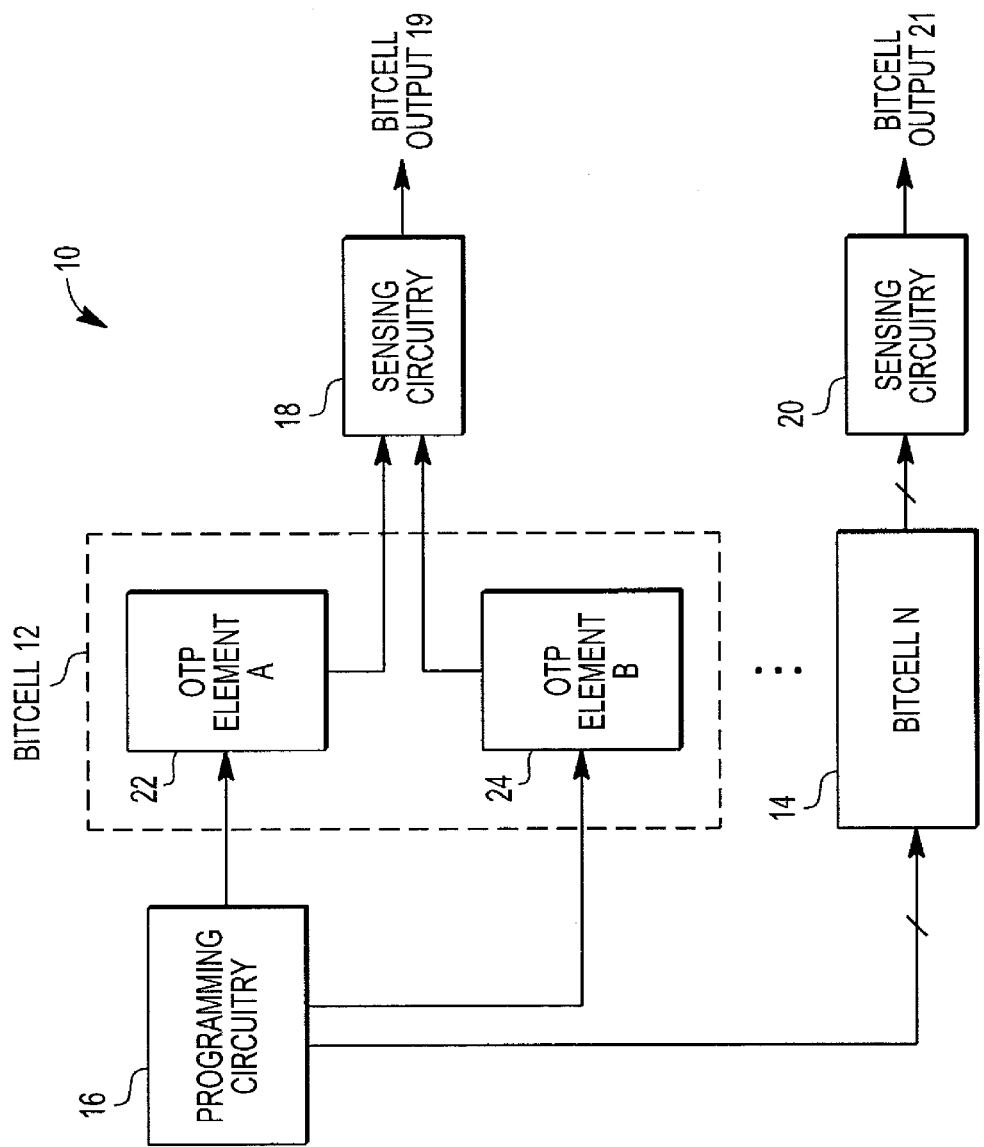
FIG. 1 illustrates, in block diagram form, a random number generator (RNG) in accordance with one embodiment of the present invention.

Random numbers are commonly needed in various applications, such as in security applications. For example, random numbers can be used for encryptions within data processing systems. One embodiment of the present invention uses at least two programmed OTP elements within a single bitcell to generate a single random bit value. That is, the bit value generated by the at least two programmed OTP elements is random in that it is not predictable prior to programming and is only known upon sensing the at least two OTP elements against each other, after programming, to determine the bit value. Any number of these bitcells may then be used to generate a random number. Furthermore, in one embodiment, since each of the at least two OTP elements which are sensed against each other are programmed, it becomes more difficult to physically inspect a difference between them and thus discern the random bit value. In this manner, improved security of the random number may be achieved.

The terms "assert" (or "set") and "negate" (or "deassert" or "clear") are used herein when referring to the rendering of a signal, status bit, or similar apparatus into its logically true and logically false state, respectively. If the logically true state is a logic level one, the logically false state is a logic level zero. And if the logically true state is a logic level zero, the logically false state is a logic level one. Each signal described herein may be designed as positive or negative logic, where negative logic can be indicated by a bar over the signal name, an asterix (*) following the name, or a "_b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

In one embodiment, OTP elements are elements which may be programmed once and, once programmed, permanently remain in the programmed state. In one embodiment, an OTP element is characterized as having a first distribution of probable values for an electrical characteristic when unprogrammed and a second distribution of probable values for the electrical characteristic when programmed. For example, an OTP element may include an electrically programmable fuse or an antifuse. One example of an electrically programmable fuse is a polysilicon-based fuse, which has a first resistance prior to programming and a second and much higher resistance upon programming. In one embodiment, the fuselink of a polysilicon-based fuse includes a polysilicon layer with an overlying silicide. Therefore, prior to programming, the fuselink has a low resistance. During programming, a current may be applied which is large enough to damage the fuselink (e.g. the silicide of the fuselink) to reduce conductivity, resulting in the higher resistance. For example, the applied programming current may cause electromigration from the silicide, may cause cracks to the silicide, or may result in the silicide fully breaking apart. Therefore, prior to programming, a polysilicon-based fuse has a lower and tighter distribution of possible resistance values as compared to after programming.

Figure 4:
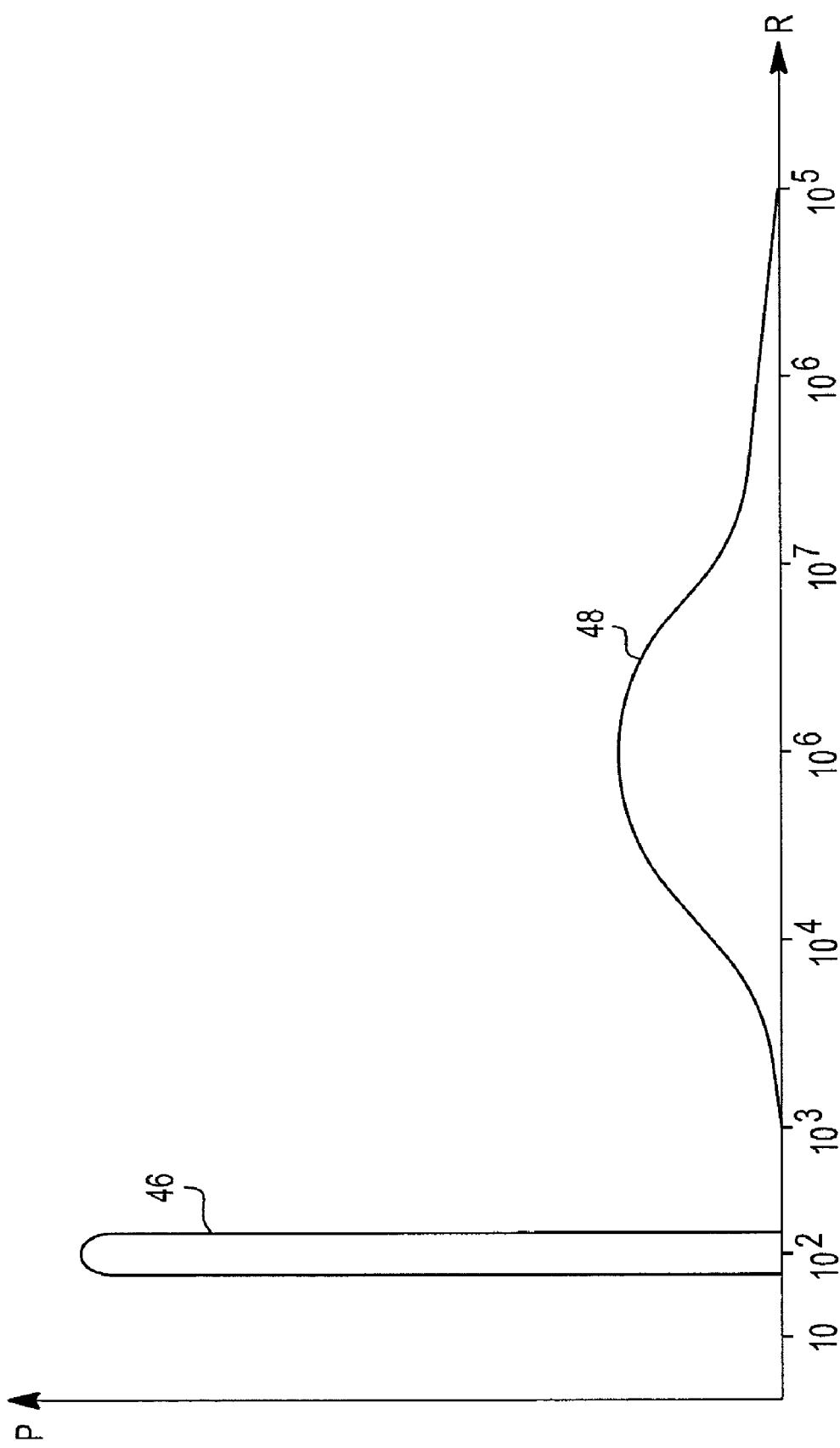
FIG. 4 illustrates an example distribution of electrical characteristics corresponding to an OTP element of the RNG of FIG. 1.

For example, FIG. 4 illustrates sample distributions for probable resistance values for an electrically programmable polysilicon-based fuse. FIG. 4 includes an unprogrammed distribution 46 and a programmed distribution 48. Distribution 46 provides a distribution of probable resistance values of the fuse prior to programming, and distribution 48 provides a distribution of probable resistance values of the fuse after programming. Therefore, note that distribution 46 is a tight distribution having an average value in the range of $10^2$ Ohms. In contrast, distribution 48 is a wider distribution beginning at about $10^3$ Ohms and proceeding up to the $10^9$ Ohms range. Therefore, when such a fuse is programmed, the value of its resistance is switched from a value within distribution 46 to a value within distribution 48, which can be any value within a wide range of values (approximately $10^3$ Ohms to $10^9$ Ohms). Therefore, note that two programmed fuses are likely to have widely varying resistances between them. Furthermore, this remains so, even if a same or similar programming current is used for both fuses. However, in one embodiment, even when two programmed fuses have different resistances, this difference is not typically detectable by physical analysis, such as SEM analysis.

Note that the distributions of FIG. 4 relate to probable values of resistance. However, in alternate embodiments, different types of OTP elements may have different distributions for the programmed state and the unprogrammed states based on electrical characteristics other than resistance. Therefore, when a programming signal (such as a current, a voltage, etc., or combinations thereof) is applied to an OTP element, the OTP element is caused to switch from being unprogrammed and having a value of its electrical characteristic within the unprogrammed distribution to being programmed and having a value of its electrical characteristic being in the programmed distribution.

FIG. 1 illustrates, in block diagram form, a random number generator (RNG) 10 in accordance with one embodiment of the present invention. RNG 10 includes one or more bitcells, such as bitcell 12 through bitcell 14. That is, note that RNG 10 may only include one bitcell, such as bitcell 12. Each bitcell in RNG 10 includes at least two OTP elements. For example, bitcell 12 includes OTP element A 22 and OTP element B 24. RNG 10 also includes programming circuitry 16 coupled to apply programming signals to each OTP element in each bitcell, such as to each of OTP element A 22 and OTP element B 24 in bitcell 12, and each of the at least two OTP elements (not shown) in bitcell 14. RNG 10 also includes sensing circuitry for each bitcell which provides a bitcell output for each bitcell. For example, RNG 10 includes sensing circuitry 18 coupled to each of OTP element A 22 and OTP element B 24 and provides bitcell output 19. RNG also include sensing circuitry 20 coupled to each of the at least two OTP elements in bitcell 14 and provides bitcell output 21. Therefore, RNG 10 may generate any number of bitcell outputs, where each bitcell output can correspond to a bit of a random number (thus the random number generated by RNG 10 can have any number of bits).

In operation, programming circuitry 16 applies a programming signal to each OTP element in each of the bitcells of RNG 10. For example, in one embodiment, programming circuitry 16 applies a programming signal to each of OTP element A 22 and OTP element B 24 which affects each OTP element such that each OTP element switches from an unprogrammed state to a programmed state. In this manner, during programming of RNG 10 to create a random number, every OTP element within every bitcell of RNG 10 is programmed from an unprogrammed state to a programmed state. Note also that, in one embodiment, once programmed, each OTP element remains permanently programmed.

Still referring to FIG. 1, sensing circuitry 18 includes a sense amplifier which senses the programmed state of OTP element A 22 against the programmed state of OTP element B 24 to provide the logic state for bitcell 12. Sensing circuitry 18 provides bitcell output 19 at a first logic state when, after programming, a value of an electrical characteristic (e.g. resistance) of OTP element A 22 exceeds a value of the electrical characteristic of OTP element B 24 and at a second state when, after programming, the value of the electrical characteristic of OTP element B 24 exceeds the value of the electrical characteristic of OTP element A 22. The first logic state is different from the second logic state. In one embodiment, the first logic state refers to a logic level one and the second logic state refers to a logic level zero. In an alternate embodiment, the first logic state refers to a logic level zero and the second state refers to a logic level one. Therefore, note that the two programmed OTP elements within single bitcell 12 generates a single logic state for bitcell 12 (corresponding to bitcell output 19) which has a random value. That is, the value of the logic state of bitcell 12 (the value of bitcell output 19) is not predictable prior to programming. Sensing circuitry 18 may also include other circuitry, such as a latch, to hold the sensed value. Further details of programming circuitry 16, bitcell 12, and sensing circuitry 18, in accordance with one embodiment, will be provided with respect to FIGS. 2 and 3. Note also that analogous descriptions may apply to bitcell 14, sensing circuitry 20, and bitcell output 21.

Figures 2, 3:
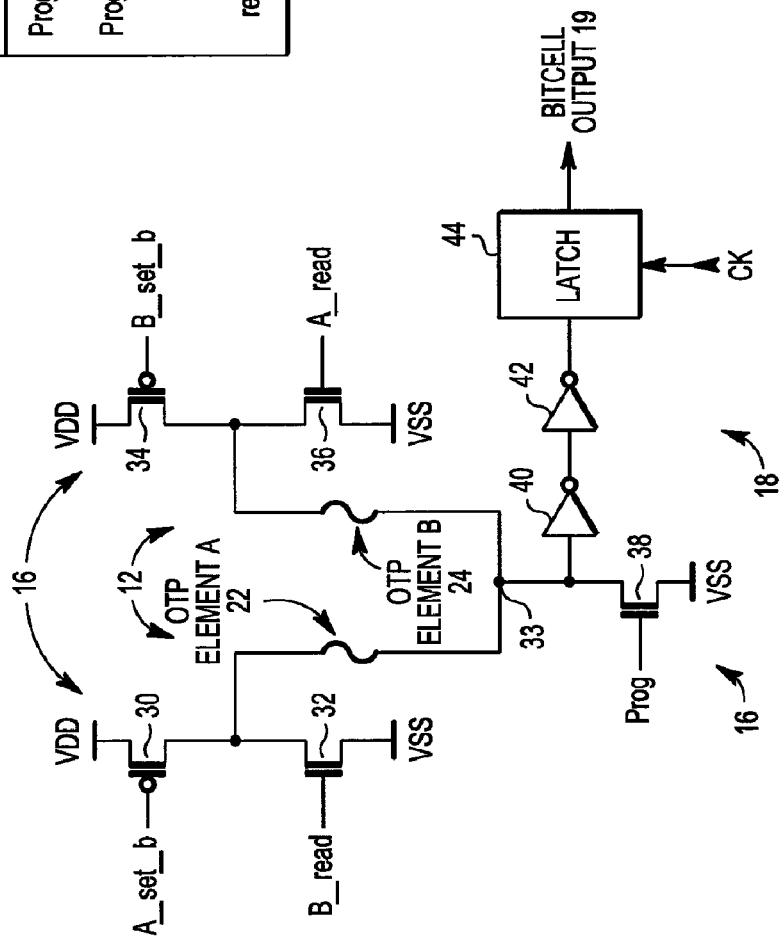
FIG. 2 illustrates, in partial schematic and partial block diagram form, a portion of the RNG of FIG. 1 in accordance with one embodiment of the present invention.
FIG. 3 illustrates a table which provides input values for various operations which can be performed on the portion of the RNG of FIG. 2.

FIG. 2 illustrates, in partial schematic and partial block diagram form, a portion of RNG 10 of FIG. 1 in accordance with one embodiment of the present invention. The portion of RNG 10 illustrated in FIG. 2 includes PMOS transistors 30 and 34, NMOS transistors 32, 36, and 38, OTP element A 22, OTP element B 24, inverters 40 and 42, and latch 44. A first current electrode of transistor 30 is coupled to a first supply voltage, VDD, a control electrode of transistor 30 is coupled to receive a signal A_set_b, and a second current electrode of transistor 30 is coupled to a first current electrode of transistor 32. A control electrode of transistor 32 is coupled to receive a signal B_read, and a second current electrode of transistor 32 is coupled to a second supply voltage, VSS. A first current electrode of transistor 34 is coupled to the first supply voltage, a control electrode of transistor 34 is coupled to receive a signal B_set_b, and a second current electrode of transistor 34 is coupled to a first current electrode of transistor 36. A control electrode of transistor 36 is coupled to receive a signal A_read, and a second current electrode of transistor 36 is coupled to the second supply voltage, VSS. A first terminal of OTP element A 22 is coupled to the second current electrode of transistor 30 and a first terminal of OTP element B 24 is coupled to the second current electrode of transistor 34. Second terminals of OTP element A 22 and OTP element B 24 are coupled to a first current electrode of transistor 38. A control electrode of transistor 38 is coupled to receive a signal Prog, and a second current electrode of transistor 38 is coupled to the second supply voltage, VSS. An input terminal of inverter 40 is coupled to the first current electrode of transistor 38, and an output terminal of inverter 40 is coupled to an input terminal of inverter 42. An output terminal of inverter 42 is coupled to an input of latch 44. Latch 44 provides bitcell output 19 and receives a clock signal, CK.

Note that transistors 30, 32, 34, 36, and 38 may all be included within programming circuitry 16, and inverters 40 and 42, and latch 44 may be included within sensing circuitry 18. OTP element A 22 and OTP element B 24 are included within bitcell 12. In the illustrated embodiment of FIG. 2, each of OTP element A 22 and OTP element B 24 is an electrically programmable fuse. In this embodiment, when each of these OTP elements switches from an unprogrammed state to a programmed state, their resistance value changes from a value within an unprogrammed distribution (such as distribution 46 of FIG. 4) to a value within a programmed distribution (such as distribution 48 of FIG. 4). In an alternate embodiment, each of OTP element A 22 and OTP element B 24 can be antifuses.

In operation, OTP elements A and B are programmed by turning on transistors 30, 34, and 38 and turning off transistors 32 and 36. This results in coupling VDD to the first terminals of OTP elements A and B, causing a large current to flow down through each of OTP elements A and B. In this manner, OTP elements A and B are switched from their unprogrammed states to their programmed states. In one embodiment, each of OTP elements A and B may be programmed at different times (e.g. sequentially) or may be programmed simultaneously. In one embodiment, when programming each of OTP elements A and B, a current of substantially equal magnitude is passed through each of OTP elements A and B (either sequentially or in parallel). Once programmed, each of OTP elements A and B has a higher resistance value than when unprogrammed, where this higher resistance value falls somewhere within the second distribution (e.g. distribution 48). However, due to the large width of distribution 48, each of OTP elements A and B are likely to have different resulting resistance values, even though both are programmed under the same conditions. Therefore, one OTP element will have a higher resistance in its programmed state as compared to the other OTP element in its programmed state. During sensing to determine the value of bitcell 12, OTP elements A and B serve as a voltage divider, where the voltage level between them, at a node 33, is detected by inverter 40. That is, the output of inverter 40 changes based upon whether the voltage at node 33 between OTP elements A and B is greater than or less than a trip point of inverter 40. Note that in alternate embodiments, other level detectors, other than an inverter, may be used in place of inverter 40. Latch 44, in one embodiment, is a clocked latch which captures the output of inverter 42 (or of inverter 40, if inverter 42 is not present) at a predetermined transition of clock signal CK and provides its output as bitcell output 19.

Operation of the portion of RNG 10 of FIG. 2 will be described in further detail with reference to the table of FIG. 3. FIG. 3 illustrates a table of values for input signals A_set_b, B_set_b, B_read, A_read, and Prog to perform the following operations: program OTP element A (Program A), program OTP element B (Program B), read bitcell 12, and read_b bitcell 12. For example, to program OTP element A, the A_set_b and Prog signals are asserted to turn on transistors 30 and 38, as was described above, and B_set_b, B_read, and A_read are negated to turn off transistors 34, 32, and 36. Therefore, in the embodiment of FIG. 3, OTP element B is not programmed while OTP element A is being programmed. To program OTP element B, the B_set_b and Prog signals are asserted to turn on transistors 34 and 38, as was described above, and A_set_b, B_read, and A_read are negated to turn off transistors 30, 32, and 36. Note that in alternate embodiments, the programming of OTP elements A and B can be done simultaneously, where, during program, the A_set_b, B_set_b, and Prog signals are all asserted to turn on transistors 30, 34, and 38, and the B_read and A_read signals are negated to turn off transistors 32 and 36.

Still referring to FIGS. 2 and 3, when a read operation is performed, A_set_b and A_read are asserted to turn on transistors 30 and 36, and B_set_b, B_read, and Prog are negated to turn off transistors 34, 32, and 38. Therefore, note that, in this embodiment, during a read operation, current flows from VDD through transistor 30, OTP element A 22, OTP element B 24, and down through transistor 36 to VSS. Therefore, the voltage at node 33 at the input of inverter 40 is a fraction of VDD, based on the resistances of OTP elements A and B. If, for example, the resistance of OTP element A 22, after programming, is greater than the resistance of OTP element B 24, after programming, the voltage at the input of inverter 40 will be less than approximately VDD/2. Therefore, in this case, the output of inverter 40 will correspond to a logic level 1, assuming the trip point of inverter 40 is approximately equal to VDD/2. Therefore, assuming that latch 44 does not perform additional inversions, bitcell output 19 will be a logic level 0. However, if the resistance of OTP element B 22, after programming, is greater than the resistance of OTP element A 22, after programming, the voltage at the input of inverter 40 will be greater than approximately VDD/2. In this case, bitcell output 19 will be a logic level 1. Therefore, based on which resistance is greater between OTP elements A and B, bitcell output 19 will have different logic states.

When a read_b operation is performed, current flows in the opposite direction. That is, B_set_b and B_read are asserted to turn on transistors 34 and 32, and A_set_b, A_read, and Prog are negated to turn off transistors 30, 36, and 38. Therefore, during a read_b operation, current flows from VDD through transistor 34, OTP element B 24, OTP element A 22, and down through transistor 32 to VSS. As with the read operation described above, the voltage at node 33 at the input of inverter 40 is a fraction of VDD, based on the resistances of OTP elements A and B. However, in this case, if, for example, the resistance of OTP element A 22, after programming, is greater than the resistance of OTP element B 24, after programming, the voltage at the input of inverter 40 will be greater than approximately VDD/2. Therefore, in this case, the output of inverter 40 will correspond to a logic level 0. Therefore, assuming that latch 44 does not perform additional inversions, bitcell output 19 will be a logic level 1 (as opposed to a logic level 0, as was the case with the read operation described above). If the resistance of OTP element B 24, after programming, is greater than the resistance of OTP element A 22, after programming, the voltage at the input of inverter 40 will be less than approximately VDD/2. In this case, bitcell output 19 will be a logic level 0. Therefore, based on which resistance is greater between OTP elements A and B, bitcell output 19 will have different logic states. However, during a read_b operation, the logic states of bitcell output 19 are opposite to what they would be during a read operation.

In one embodiment, performing the read and read_b operations in the manner described above assumes that, with control electrodes asserted, the resistance between the first and second current electrodes of transistors 30, 32, 34, and 36 is negligible compared to the resistance of the OTP element A and OTP element B after programming. This can be achieved through appropriate dimensioning of the transistor width and length. In another approach, if the resistance between the first and second current electrodes of transistors 30, 32, 34, and 36 is not negligible compared to the resistance of the OTP element A and OTP element B after programming, the transistors can still be dimensioned such that their resistance between the first and second current electrodes does not influence the input voltage of inverter 40. This can be achieved for instance by dimensioning transistors 30, 32, 34, and 36 such that if the transistor's control electrodes are asserted, the resistance between the two current electrodes of transistors 30, 32, 34, and 36 are all identical. In yet another approach, the resistance between the first and second current electrodes of transistors 30, 32, 34, and 36 can be controlled and set to the desired value by appropriate choice of the control electrode voltage used.

In one embodiment, the use of a read operation and a read_b operation may be used to test bitcell 12. For example, if, after programming, bitcell output 19 does not provide different logic states for a read operation and a read_b operation, a problem with bitcell 12 may be indicated. For example, such a problem may occur when the programmed resistances of OTP elements A and B are within a predetermined margin of each other.

In an alternate embodiment, different values of VDD may be used for program operations versus read operations (such as read and read_b operations). In this case, the signals which are at a logic level one during a program operation may be at a different value than the signals which are at a logic level one during a read operation. Also, in alternate embodiments, each bitcell may include more than two OTP elements where additional logic may be performed to obtain a bitcell output corresponding to the more than two OTP elements.

In the illustrated embodiment, the resulting differences in resistances between OTP elements A and B after programming allow for a random value to be generated. For example, during programming, it is unknown which of OTP elements A and B will result in the higher resistance. Therefore, the logic state of bitcell output 19 provided during a read operation is not known and cannot be predicted prior to programming OTP elements A and B. Furthermore, to determine the value of bitcell 12 after programming, a read operation on bitcell 12 is performed to sense this previously unknown value. In this manner, using the wide programmed distribution of an electrical characteristic (such as resistance) of OTP elements A and B, a random value may be generated. Furthermore, once programmed, it may not be easily discernable which of OTP elements A and B has the higher resistance. Also, even though, after programming, the value of bitcell 12 can be sensed, it cannot be recreated using a different instantiation of the same circuitry because each time unprogrammed OTP elements are programmed, it is not predictable what their programmed resistances will be. Therefore, the output of a bitcell cannot be forced to a predetermined value. That is, this random number generator may be difficult to clone.

By now it should be appreciated that a bitcell having at least two programmed OTP elements can be used to generate a random bitcell value. Therefore, a plurality of bitcells, each having at least two programmed OTP elements, can be used to generate a random number. Furthermore, this random number may be difficult to discern using physical analysis such as SEM analysis, and this random number may be difficult to clone since a value of an electrical characteristic of a programmed OTP element cannot be predicted prior to programming.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Also for example, in one embodiment, the illustrated elements of RNG 10 are circuitry located on a single integrated circuit or within a same device. Alternatively, RNG 10 may include any number of separate integrated circuits or separate devices interconnected with each other. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, OTP elements A and B can be implemented as fuses, antifuses, or as another type of OTP element. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a random number generator having a first one time programmable (OTP) element, a second OTP element, wherein the first OTP element and second OTP element are characterized by having a first distribution of probable values for an electrical characteristic when unprogrammed and a second distribution of probable values for the electrical characteristic when programmed. The random number generator of item 1 further includes a programming circuit coupled to the first OTP element and the second OTP element that applies a programming signal to the first OTP element and to the second OTP element causing the first OTP element to switch from being unprogrammed and having its electrical characteristic within the first distribution to being programmed and to have a first value within the second distribution for its electrical characteristic and causing the second OTP element to switch from being unprogrammed and having its electrical characteristic within the first distribution to being programmed and to have a second value within the second distribution for its electrical characteristic. The random number generator of item 1 further includes a sense amplifier, coupled to the first OTP element and second OTP element, that provides an output signal at a first logic state when the first value exceeds the second value and at a second logic state when the second value exceeds the first value. Item 2 includes the random number generator of item 1, wherein the programming circuit is further characterized as causing the first OTP element and the second OTP element to be permanently programmed. Item 3 includes the random number generator of item 1, wherein the first OTP element and the second OTP element are characterized as being antifuses. Item 4 includes the random number generator of item 1, wherein the first OTP element and the second OTP element are characterized as being fuses. Item 5 includes the random number generator of item 4, wherein the fuses comprise silicide. Item 6 includes the random number generator of item 5, wherein the fuses further comprise polysilicon. Item 7 includes the random number generator of item 1, wherein the first OTP element has a first terminal coupled to a first terminal of the second OTP element to form a voltage divider, and the sense amplifier has an input coupled to the first terminals of the first OTP element and the second OTP element. Item 8 includes the random number generator of item 7, wherein the sense amplifier comprises a level detector. Item 9 includes the random number generator of item 8, wherein the sense amplifier further comprises a latch coupled to the level detector. Item 10 includes the random number generator of item 1, and further includes a plurality of bitcells each comprised of a pair of OTP elements, and a plurality of latches coupled to the plurality of bitcells clocked by a clock signal. Item 11 includes the random number generator of item 1, wherein the programming circuit includes a first transistor coupled between a first power supply terminal and a first terminal of the first OTP element, a second transistor coupled between the first power supply terminal and a first terminal of the second OTP element, wherein second terminals of the first OTP element and second OTP element are coupled together, and a third transistor coupled between the second terminals and a second power supply terminal. Item 12 includes the random number generator of item 1, wherein the programming circuit passes current of substantially equal magnitude through the first OTP element and the second OTP element to cause the first OTP element and the second OTP element to switch from the unprogrammed state to the programmed state.

Item 13 includes a method of generating a random number including providing a first one time programmable (OTP) element and a second OTP element, wherein the first OTP element and second OTP element are characterized by having a first distribution of probable values for an electrical characteristic when unprogrammed and a second distribution of probable values for the electrical characteristic when programmed; programming the first OTP element and the second OTP element thereby causing the first OTP element to switch from being unprogrammed and having its electrical characteristic within the first distribution to being programmed and to have a first value within the second distribution for its electrical characteristic and causing the second OTP element to switch from being unprogrammed and having its electrical characteristic within the first distribution to being programmed and to have a second value within the second distribution for its electrical characteristic; and providing an output signal at a first logic state when the first value exceeds the second value and at a second logic state when the second value exceeds the first value. Item 14 includes the method of item 13, wherein the step of programming is further characterized by the first OTP element and the second OTP element being permanently switched to being programmed. Item 15 includes the method of item 13, wherein the step of providing a first one time programmable (OTP) element and a second OTP element is further characterized by the first one time programmable (OTP) element and a second OTP element being fuses. Item 16 includes the method of item 13, wherein the step of providing a first one time programmable (OTP) element and a second OTP element is further characterized by the first one time programmable (OTP) element and a second OTP element being antifuses. Item 17 includes the method of item 13, wherein the step of providing a first one time programmable (OTP) element and a second OTP element is further characterized by the first one time programmable (OTP) element and a second OTP element comprise polysilicon and silicide, and wherein the step of programming is further characterized by damaging at least the silicide. Item 18 includes the method of item 13 and further includes biasing the first OTP element and the second OTP element to form a voltage divider so that a sense voltage is present at a node coupled to a first terminal of the first OTP element and a first terminal of the second OTP element, wherein the step of providing the output signal is further characterized as sensing the sense voltage at the node.

Item 19 includes a random number generator including a bitcell having a first fuse comprising polysilicon and silicide and a second fuse comprising polysilicon and silicide, programming means for blowing the first fuse by damaging the silicide of the first fuse to cause an increase in resistance to a first value and blowing the second fuse by damaging the silicide of the second fuse to cause a change in resistance to a second value, and sense amplifier means, coupled to the bitcell, for providing an output representative of a logic state of the bitcell at a first logic state if the first value is greater than the second value and at a second logic state if the second value is greater than the first value. Item 20 includes the random number generator of item 19, wherein the programming means is further characterized as blowing the first and second fuses by passing current of substantially equal magnitude through the first and second fuses.

What is claimed is:

1. A random number generator, comprising:
   a first one time programmable (OTP) element;
   a second OTP element,
   wherein the first OTP element and second OTP element are characterized by having a first distribution of probable values for an electrical characteristic when unprogrammed and a second distribution of probable values for the electrical characteristic when programmed;
   a programming circuit coupled to the first OTP element and the second OTP element that applies a programming signal to the first OTP element and to the second OTP element causing the first OTP element to switch from being unprogrammed and having its electrical characteristic within the first distribution to being programmed and to have a first value within the second distribution for its electrical characteristic and causing the second OTP element to switch from being unprogrammed and having its electrical characteristic within the first distribution to being programmed and to have a second value within the second distribution for its electrical characteristic; and
   a sense amplifier, coupled to the first OTP element and second OTP element, that provides an output signal at a first logic state when the first value exceeds the second value and at a second logic state when the second value exceeds the first value, wherein:
   the first OTP element has a first terminal coupled to a first terminal of the second OTP element to form a voltage divider; and
   the sense amplifier has an input coupled to the first terminals of the first OTP element and the second OTP element.

2. The random number generator of claim 1, wherein:
   the programming circuit is further characterized as causing the first OTP element and the second OTP element to be permanently programmed.

3. The random number generator of claim 1, wherein the first OTP element and the second OTP element are characterized as being antifuses.

4. The random number generator of claim 1, wherein the first OTP element and the second OTP element are characterized as being fuses.

5. The random number generator of claim 4, wherein the fuses comprise silicide.

6. The random number generator of claim 5, wherein the fuses further comprise polysilicon.

7. The random number generator of claim 1, wherein the sense amplifier comprises a level detector.

8. The random number generator of claim 7, wherein the sense amplifier further comprises a latch coupled to the level detector.

9. The random number generator of claim 1, further comprising:
- a plurality of bitcells each comprised of a pair of OTP elements; and
- a plurality of latches coupled to the plurality of bitcells clocked by a clock signal.

10. The random number generator of claim 1, wherein the programming circuit comprises:
- a first transistor coupled between a first power supply terminal and a first terminal of the first OTP element;
- a second transistor coupled between the first power supply terminal and a first terminal of the second OTP element, wherein second terminals of the first OTP element and second OTP element are coupled together; and
- a third transistor coupled between the second terminals and a second power supply terminal.

11. The random number generator of claim 1, wherein the programming circuit passes current of substantially equal magnitude through the first OTP element and the second OTP element to cause the first OTP element and the second OTP element to switch from the unprogrammed state to the programmed state.

12. A method of generating a random number, comprising:
providing a first one time programmable (OTP) element and a second OTP element,
wherein the first OTP element and second OTP element are characterized by having a first distribution of probable values for an electrical characteristic when unprogrammed and a second distribution of probable values for the electrical characteristic when programmed;
programming the first OTP element and the second OTP element thereby causing the first OTP element to switch from being unprogrammed and having its electrical characteristic within the first distribution to being programmed and to have a first value within the second distribution for its electrical characteristic and causing the second OTP element to switch from being unprogrammed and having its electrical characteristic within the first distribution to being programmed and to have a second value within the second distribution for its electrical characteristic;
providing an output signal at a first logic state when the first value exceeds the second value and at a second logic state when the second value exceeds the first value; and
biasing the first OTP element and the second OTP element to form a voltage divider so that a sense voltage is present at a node coupled to a first terminal of the first OTP element and a first terminal of the second OTP element,
wherein the step of providing the output signal is further characterized as sensing the sense voltage at the node.

13. The method of claim 12, wherein the step of programming is further characterized by the first OTP element and the second OTP element being permanently switched to being programmed.

14. The method of claim 12, wherein the step of providing a first one time programmable (OTP) element and a second OTP element is further characterized by the first one time programmable (OTP) element and a second OTP element being fuses.

15. The method of claim 12, wherein the step of providing a first one time programmable (OTP) element and a second OTP element is further characterized by the first one time programmable (OTP) element and a second OTP element being antifuses.

16. The method of claim 12, wherein:
the step of providing a first one time programmable (OTP) element and a second OTP element is further characterized by the first one time programmable (OTP) element and a second OTP element comprise polysilicon and silicide; and
the step of programming is further characterized by damaging at least the silicide.

* * * * *